(12) United States Patent
Zhu et al.

(10) Patent No.: US 8,598,666 B2
(45) Date of Patent: Dec. 3, 2013

(54) SEMICONDUCTOR STRUCTURE AND METHOD FOR MANUFACTURING THE SAME

(75) Inventors: Huilong Zhu, Poughkeepsie, NY (US); Haizhou Yin, Poughkeepsie, NY (US); Zhijiong Luo, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 39 days.

(21) Appl. No.: 13/504,935

(22) PCT Filed: Nov. 3, 2011

(86) PCT No.: PCT/CN2011/002003
§ 371 (c)(1),
(2), (4) Date: Apr. 27, 2012

(87) PCT Pub. No.: WO2013/033877
PCT Pub. Date: Mar. 14, 2013

(65) Prior Publication Data
US 2013/0056829 A1      Mar. 7, 2013

(30) Foreign Application Priority Data
Sep. 7, 2011   (CN) .......................... 2011 1 0263440

(51) Int. Cl.
*H01L 27/12* (2006.01)

(52) U.S. Cl.
USPC .............. 257/351; 257/365; 257/E27.062; 257/E23.067

(58) Field of Classification Search
USPC ................. 257/347, 351, 365, 366, E27.062, 257/E23.067, E23.174
See application file for complete search history.

(56) References Cited

U.S. PATENT DOCUMENTS

2005/0037582 A1    2/2005   Dennard et al. ............. 438/281
2007/0018246 A1    1/2007   Kato et al. .................. 257/347
2007/0063284 A1    3/2007   Kawahara et al. ........... 257/351
2007/0075317 A1*   4/2007   Kato et al. .................... 257/74
2007/0132011 A1    6/2007   Kato ............................ 257/324
2008/0182380 A1    7/2008   Oka ............................. 438/425
2010/0200919 A1    8/2010   Kikuchi ....................... 257/351

FOREIGN PATENT DOCUMENTS

| CN | 1830090 A    | 9/2006 | ......... H01L 29/786 |
| CN | 1901228 A    | 1/2007 | ......... H01L 29/786 |
| CN | 1901231 A    | 2/2007 | ......... H01L 27/02  |
| CN | 1979879 A    | 6/2007 | ......... H01L 21/336 |
| CN | 101800228 A  | 8/2010 | ......... H01L 27/12  |
| JP | 2011138876 A | 7/2011 | ......... H01L 29/786 |

* cited by examiner

*Primary Examiner* — Tucker Wright
(74) *Attorney, Agent, or Firm* — Martine Penilla Group, LLP

(57) ABSTRACT

The present invention relates to a semiconductor structure and a method for manufacturing the same. A semiconductor structure comprises: a semiconductor substrate; a first insulating material layer, a first conductive material layer, a second insulating material layer, a second conductive material layer and an insulating buried layer formed in sequence on the semiconductor substrate; a semiconductor layer bonded on the insulating buried layer; transistors formed on the semiconductor layer, the channel regions of the transistors each being formed in the semiconductor layer and each having a back-gate formed from the second conductive material layer; a dielectric layer covering the semiconductor layer and the transistors; isolation structures for at least electrically isolating each transistor from its adjacent transistors, the top of the isolation structures being flush with or slightly higher than the upper surface of the semiconductor layer, and the bottom of the isolation structures being in the second insulating material layer; and a conductive contact running through the dielectric layer and extending down into the first conductive material layer.

16 Claims, 5 Drawing Sheets

SEMICONDUCTOR STRUCTURE AND METHOD FOR MANUFACTURING THE SAME

CLAIM OF PRIORITY

This application is a Section 371 National Stage Application of International Application No. PCT/CN2011/002003, filed on Nov. 30, 2011, which claims priority to Chinese Application No. CN201110263440.2, filed on Sep. 7, 2011 entitled "Semiconductor Structure and Method for Manufacturing the Same", the entire contents of which are incorporated herein by reference in their entirety.

FIELD OF THE INVENTION

The present invention relates to the field of semiconductor fabrication, and more particularly, to a semiconductor structure and a method for manufacturing the same.

BACKGROUND OF THE INVENTION

Generally, an integrated circuit (IC) includes a combination of NMOS (n type Metal-Oxide-Semiconductor) transistors and PMOS (p type Metal-Oxide-Semiconductor) transistors formed on a substrate. In order to increase the efficiency of the very large scale integrated circuits and to reduce the manufacturing costs, a continuous trend is to reduce the feature size of the device, especially the length of the gate. However, the reduction in the length of the gate will result in short-channel effects, thus degrading the performances of the semiconductor device and the whole integrated circuit.

The SOI (Silicon-On-Insulator) technique is to introduce a buried oxide layer (BOX) between the top layer silicon and the substrate. The existence of the buried oxide layer enables a complete dielectric isolation between elements in the integrated circuit, so the SOI-CMOS integrated circuit substantially avoids the parasitic latch-up effect in the bulk silicon CMOS circuit. Meanwhile, in the complete depletion type SOI device, short-channel effects are small, a shallow junction can be naturally formed, and the leakage is small. Therefore, the complete depletion SOI-MOSFET having an ultrathin SOI and dual gates have attracted wide attention. In order to adjust the threshold voltage and to suppress the short-channel effects, a ground plane, which is sometimes used for connecting to the semiconductor layer, is formed under the ultrathin oxide buried layer in the SOI-MOSFET device, and the ground plane is made to have a low resistance so as to form a back-gate structure of the transistor. However, according to conventional methods, in order to connect the ground planes of the NMOSFET and PMOSFET to the respective voltage sources, extra contacts and interconnections are needed, resulting in an increase in the area occupied by the device.

Hence, there is a need for an improved method to connect the ground planes of the NMOSFET and PMOSFET to the respective voltage sources to reduce the area occupied by the device.

SUMMARY OF THE INVENTION

An object of the present invention is to provide an improved semiconductor structure and a method for manufacturing the same, so that it is unnecessary to provide a separate contact for the back-gate for each transistor when manufacturing the integrated circuit, thereby reducing the area occupied by the transistors.

To achieve the above object, according to a first aspect of the present invention, a semiconductor structure is provided, which comprises: a semiconductor substrate; a first insulating material layer on the semiconductor substrate; a first conductive material layer on the first insulating material layer; a second insulating material layer on the first conductive material layer; a second conductive material layer on the second insulating material layer; an insulating buried layer on the second conductive material layer; a semiconductor layer on the insulating buried layer; transistors formed on the semiconductor layer, the transistors at least comprising a first group of transistors and a second group of transistors, the channel regions of the transistors each being formed in the semiconductor layer and each having a back-gate formed from the second conductive material layer; a dielectric layer covering the semiconductor layer and the transistors; isolation structures for at least electrically isolating each transistor from its adjacent transistors, the top of the isolation structures being flush with or slightly higher than the upper surface of the semiconductor layer, and the bottom of the isolation structures being in the second insulating material layer; and a conductive contact running through the dielectric layer and extending down into the first conductive material layer, the conductive contact being isolated from the transistors by means of at least one of the isolation structures, and the first conductive material layer being electrically connected to outside by the conductive contact to realize control of the back-gate voltages of the first group of transistors.

According to a second aspect of the present invention, a method for manufacturing a semiconductor structure is provided, which comprises: providing a semiconductor substrate; forming on the semiconductor substrate a first insulating material layer, a first conductive material layer, a second insulating material layer, a second conductive material layer and an insulating buried layer in sequence; bonding a semiconductor layer on the insulating buried layer; forming isolation structures running through the semiconductor layer, the insulating buried layer and the second conductive material layer, the top of the isolation structures being flush with or slightly higher than the upper surface of the semiconductor layer and the bottom of the isolation structure being in the second insulating material layer; forming transistors on the semiconductor layer, the transistors at least comprising a first group of transistors and a second group of transistors, the channel regions of the transistors each being formed in the semiconductor layer and each having a back-gate formed from the second conductive material layer, wherein each transistor is isolated from its adjacent transistors by means of the isolation structures; forming a dielectric layer covering the semiconductor layer and the transistors; and forming a conductive contact running through the dielectric layer and extending down into the first conductive material layer, the conductive contact being isolated from the transistors by means of at least one of the isolation structures, and the first conductive material layer being electrically connected to outside by the conductive contact to realize control of the back-gate voltages of the first group of transistors.

According to a third aspect of the present invention, a semiconductor structure is provided, which comprises: a semiconductor substrate; a first insulating material layer on the semiconductor substrate; a first conductive material layer on the first insulating material layer; a second insulating material layer on the first conductive material layer; a second conductive material layer on the second insulating material layer; a third insulating material layer on the second conductive material layer; a third conductive material layer on the third insulating material layer; an insulating buried layer on the third conductive material layer; a semiconductor layer on the insulating buried layer; transistors formed on the semiconductor layer, the transistors at least comprising a first group of transistors and a second group of transistors, the channel regions of the transistors each being formed in the semiconductor layer and each having a back-gate formed from the third conductive material layer; a dielectric layer covering the semiconductor layer and the transistors; a plurality of first isolation structures, the top of which being flush with or slightly higher than the upper surface of the semiconductor layer and the bottom of which being in the second insulating material layer; a plurality of second isolation structures, the top of which being flush with or slightly higher than the upper surface of the semiconductor layer and the bottom of which being in the third insulating material layer; a first conductive contact running through the dielectric layer, one of the first isolation structures, and the second insulating material layer to reach the first conductive material layer; and a second conductive contact running through the dielectric layer, one of the second isolation structures, and the third insulating material layer to reach the second conductive material layer, wherein isolators surrounding each of the first group of transistors each comprise the first isolation structures, and isolators surrounding each of the second group of transistors each comprise the second isolation structures on at least one side of the respective one of the second group of transistors and comprise the first isolation structures on the remaining sides thereof, so that the portions of the second conductive material layer under each of the second group of transistors are in electrical communication with the portion of the second conductive material layer under the second conductive contact.

According to a fourth aspect of the present invention, a method for manufacturing a semiconductor structure is provided, which comprises: providing a semiconductor substrate; forming on the semiconductor substrate a first insulating material layer, a first conductive material layer, a second insulating material layer, a second conductive material layer, a third insulating material layer, a third conductive material layer and an insulating buried layer in sequence; bonding a semiconductor layer on the insulating buried layer; forming a plurality of first isolation structures, the top of which being flush with or slightly higher than the upper surface of the semiconductor layer and the bottom of which being in the second insulating material layer; forming a plurality of second isolation structures, the top of which being flush with or slightly higher than the upper surface of the semiconductor layer and the bottom of which being in the third insulating material layer; forming transistors on the semiconductor layer, the transistors at least comprise a first group of transistors and a second group of transistors, the channel regions of the transistors each being formed in the semiconductor layer and each having a back-gate formed from the third conductive material layer; forming a dielectric layer covering the semiconductor layer and the transistors; forming a first conductive contact running through the dielectric layer, one of the first isolation structures, and the second insulating material layer; and forming a second conductive contact running through the dielectric layer, one of the second isolation structures, and the third insulating material layer, wherein isolators surrounding each of the first group of transistors each comprise the first isolation structure, and isolators surrounding each of the second group of transistors each comprise the second isolation structure on at least one side of the respective one of the second group of transistors and comprise the first isolation structure on the remaining sides of the respective one of the second group of transistors, so that the portions of the second conductive material layer under each of the second group of transistors are in electrical communication with the portion of the second conductive material layer under the second conductive contact.

In the semiconductor structure manufactured by the method according to the present invention, it is unnecessary to provide a separate contact for the back-gate for each transistor, and instead, a voltage can be applied to the back-gates of at least some of the transistors through a capacitive coupling to the conductive layer under the transistors which is connected to outside via a conductive contact. Thus, the area occupied by at least some of the transistors can be greatly reduced, which accordingly increases the utilization ratio of the wafer. In a preferred embodiment, the back-gates of all nMOSFETs are capacitively coupled to a common conductive layer so as to be connected to outside by means of a conductive contact, while the back-gates of all pMOSFETs are capacitively coupled to another common conductive layer so as to be connected to outside by means of another conductive contact. Hence, only two contacts for the back-gates are necessary to be formed on the whole integrated circuit, which greatly increases the utilization ratio of the wafer.

DETAILED DESCRIPTION OF THE PREFERRED EMBODIMENTS

The exemplary embodiments of the present invention will be described in detail below with reference to the drawings. The drawings are schematic and are not drawn to scale, and they only intend to illustrate the embodiments of the present invention rather than limiting the protection scope of the present invention. Throughout the drawings, the same or similar reference numbers represent the same or similar elements. To make the technical solution of the present invention clearer, the process steps and devices known in the art are omitted herein. In addition, in the context of this description, one layer being on another layer includes both of the case in which the two layers are in direct contact and the case in which other layers or elements are inserted between the two layers.

<First Embodiment>

Figure 1:
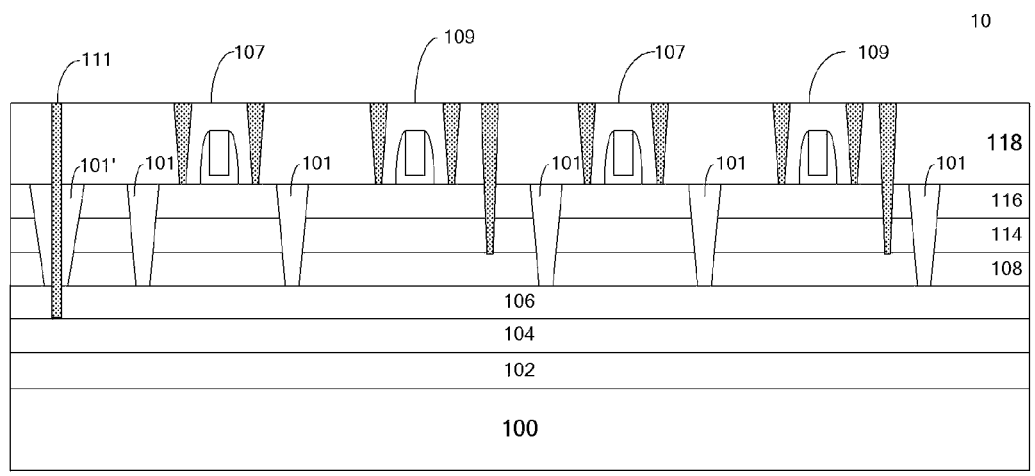
FIG. 1 shows a schematic cross-sectional view of a semiconductor structure comprising transistors having back-gates according to a first embodiment of the present invention.

FIG. 1 shows a schematic cross-sectional view of a semiconductor structure 10 comprising transistors having back-gates according to a first embodiment of the present invention.

The semiconductor structure 10 comprises: a semiconductor substrate 100; a first insulating material layer 102 on the semiconductor substrate 100; a first conductive material layer 104 on the first insulating material layer 102; a second insulating material layer 106 on the first conductive material layer 104; a second conductive material layer 108 on the second insulating material layer 106; an insulating buried layer 114 on the second conductive material layer 108; and a semiconductor layer 116 bonded on the insulating buried layer 114.

The semiconductor structure 10 further comprises transistors formed on the semiconductor layer 116. The conductive channels of these transistors are all formed in the semiconductor layer 116 and the back-gates of these transistors are all formed from the second conductive material layer 108. As an example, the transistors comprise a transistor 107 of a first conductive type and a transistor 109 of a second conductive type. Preferably, the first conductive type is different from the second conductive type. A dielectric layer 118 covers the semiconductor layer 116 and the transistors.

The semiconductor structure 10 further comprises first isolation structures 101 for electrically isolating the individual transistors, and a second isolation structure 101'. The lower surfaces of the isolation structures 101 and 101' are flush with the lower surface of the second conductive material layer 108, or are below the lower surface of the second conductive material layer 108 and located in the second insulating material layer 106. The top surfaces of the isolation structures 101 and 101' are flush with or slightly higher than the upper surface of the semiconductor layer 116. A conductive contact 111 for electrically connecting the first conductive material layer 104 to outside may run through the dielectric layer 118, the second isolation structure 101', and the second insulating material layer 106 to reach the upper surface of the first conductive material layer 104 or to be in the first conductive material layer 104. Alternatively, the conductive contact 111 may run through the dielectric layer 118, the semiconductor layer 116, the insulating buried layer 114, the second conductive material layer 108, and the second insulating material layer 106 to reach the upper surface of the first conductive material layer 104 or to be in the first conductive material layer 104. Meanwhile, the conductive contact 111 is isolated from each transistor by means of the second isolation structure 101' and the first isolation structures 101.

In the case where the first conductive material layer 104 is electrically connected to outside by the conductive contact 111, the back-gate voltages of the transistors can be controlled by means of the conductive contact 111 by applying a voltage from the outside owing to the capacitive coupling between the second conductive material layer 108, which acts as the back-gates of the transistors, and the first conductive material layer 104. Thus, it can be selected to control the back-gate voltages of some or all of the transistors of the first conductive type or some or all of the transistors of the second conductive type as required. As for the rest of the transistors whose back-gate voltages are not applied through the conductive contact 111, their back-gate contacts can be made with conventional techniques (as those for the transistor 109 of the second conductive type shown in FIG. 1 as an example), which will not be described in detail here because it is known to those skilled in the art.

Of course, the semiconductor structure 10 further comprises the gate contact (not shown), the source/drain contacts, etc. of each transistor. In this embodiment, the transistor of the first conductive type is, for example, an nMOSFET or a pMOSFET. Correspondingly, the transistor of the second conductive type is, for example, a pMOSFET or an nMOSFET.

It shall be noted herein that in some other embodiments of the present invention, all transistors 107 of the first conductive type may be replaced by a group of transistors to which a specific back-gate voltage need to be applied. In this case, it is unnecessary to limit the conductive type of the group of transistors. That is to say, the group of transistors may not necessarily have the same conductive type, as long as the same back-gate voltage can be applied to the group of the specific transistors without adding extra conductive contacts.

In the semiconductor structure 10 according to the present embodiment, a voltage is applied to the back-gates of the transistors 107 of the first conductive type through the capacitive coupling between the second conductive material layer 108 and the first conductive material layer 104. Thus, it is unnecessary to separately form a back-gate contact for each of the transistors 107 of the first conductive type. Therefore, the area occupied by one device is reduced and the utilization ratio of the wafer is increased.

A method for manufacturing the semiconductor structure 10 will be described below.

Figure 2:
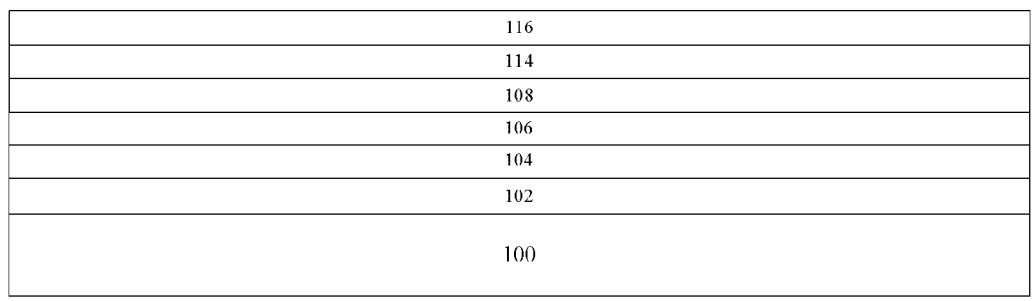
FIG. 2 shows a schematic cross-sectional view of a stage in manufacturing the semiconductor structure shown in FIG. 1.

First, a first insulating material layer 102, a first conductive material layer 104, a second insulating material layer 106, a second conductive material layer 108, and an insulating buried layer 114 are deposited in sequence on a semiconductor substrate 100. Preferably, the insulating buried layer 114 is a thin oxide layer. Then, a semiconductor layer 116 is bonded onto the insulating buried layer 114. The resulting structure is shown in FIG. 2. As an example, the semiconductor layer 16 can be bonded onto the insulating buried layer 114 by means of, for example, the SmartCut™ technique well known in the art, thereby forming a Semiconductor-On-Insulator (SOI) structure.

Figure 3:
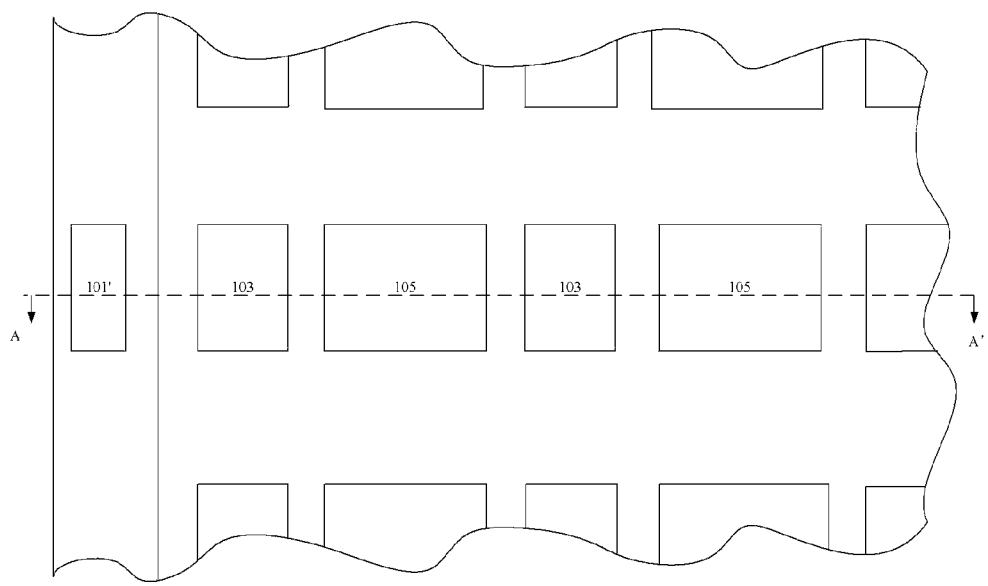
FIG. 3 shows a schematic top view of another stage in manufacturing the semiconductor structure shown in FIG. 1.
Figure 4:
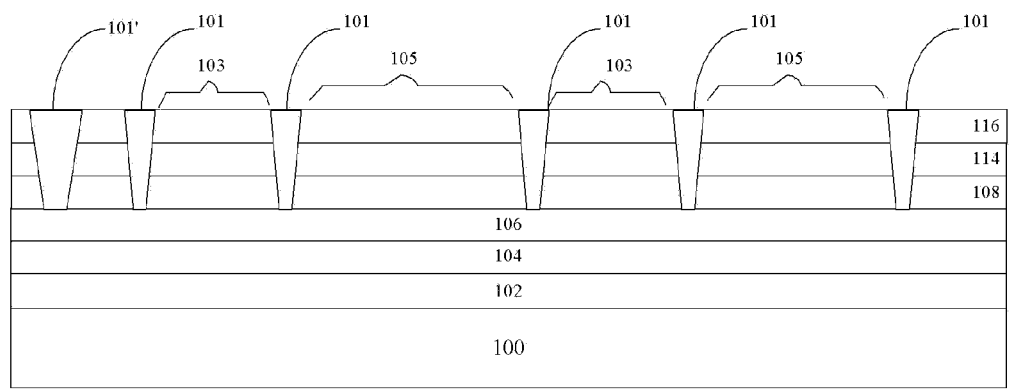
FIG. 4 shows a cross-sectional view taken along a line AA' of FIG. 3.

Next, first isolation structures 101 are formed to surround the area in which the transistors are to be formed. Moreover, a second isolation structure 101' is formed. The lower surfaces of the isolation structures 101 and 101' are flush with the lower surface of the second conductive material layer 108, or are below the lower surface of the second conductive material layer 108 and located in the second insulating material 106. Meanwhile, the top surfaces of the isolation structures 101 and 101' are flush with or slightly higher than the upper surface of the semiconductor layer 116. Thus, the structures shown in FIGS. 3 and 4 are obtained, wherein FIG. 4 is a cross-sectional view taken along a line AA' of FIG. 3. Reference numbers 103 and 105 represent the areas in which transistors 107 of a first conductive type and transistors 109 of a second conductive type are to be formed, respectively. The isolation structures 101 and 101' can be formed by such processes as photolithography, etching, and deposition that are well known in the art, which will not be described in detail here in order to highlight the features and advantages of the present invention.

Then, the transistors 107 of the first conductive type and the transistors 109 of the second conductive type are formed in the areas 103 and 105 respectively using the processes well known in the art. Next, a dielectric layer 118 and a gate contact (not shown) and source/drain contacts of each transistor are formed. As an example, back-gate contacts of the transistors 109 of the second conductive type are formed; conductive contacts 111 running through the dielectric layer 118, the second isolation structure 101', and the second insulating material layer 106 are formed; and so on. The above-mentioned processes are known in the art, so in order to highlight the features and advantages of the present invention, they will not be described in detail herein.

In this embodiment, in addition to the isolation structures 101 for isolating the transistors, the isolation structure 101' is also formed to accommodate the conductive contact 111. However, the present invention is not limited to the above embodiment, and the conductive contacts 111 can be formed in any one of the isolation structures 101 by one have ordinary skills in the art as required.

<Second Embodiment>

Figure 5:
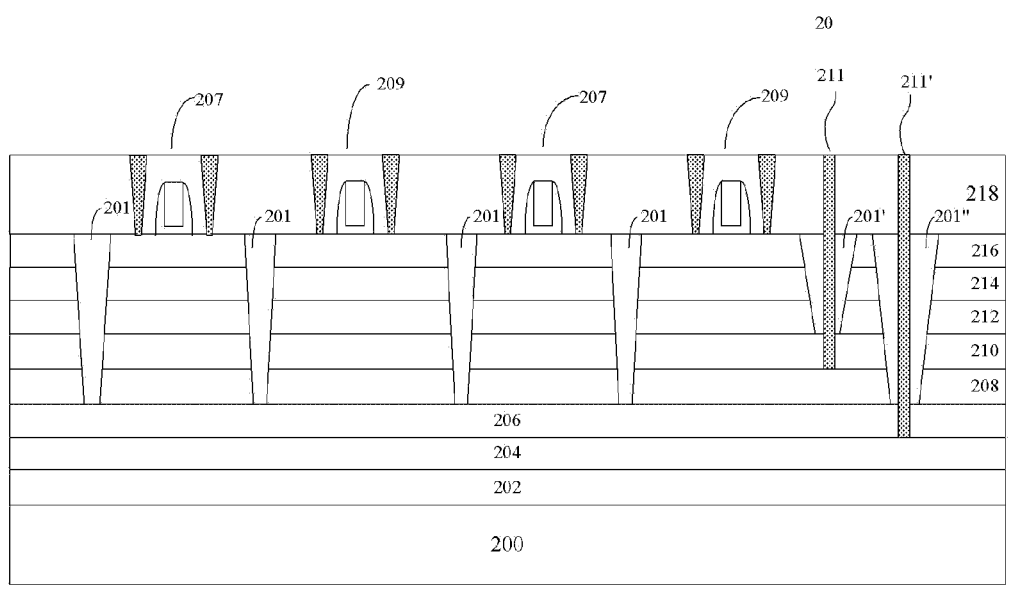
FIG. 5 shows a schematic cross-sectional view of a semiconductor structure comprising transistors having back-gates according to a second embodiment of the present invention.

FIG. 5 shows a schematic cross-sectional view of a semiconductor structure 20 comprising transistors having back-gates according to a second embodiment of the present invention.

The semiconductor structure 20 comprises: a semiconductor substrate 200; a first insulating material layer 202 on the semiconductor substrate 200; a first conductive material layer 204 on the first insulating material layer 202; a second insulating material layer 206 on the first conductive material layer 204; a second conductive material layer 208 on the second insulating material layer 206; a third insulating material layer 210 on the second conductive material layer 208; a third conductive material layer 212 on the third insulating material layer 210; an insulating buried layer 214 on the third conductive material layer 212; and a semiconductor layer 216 bonded on the insulating buried layer 214.

The semiconductor structure 20 further comprises transistors formed on the semiconductor layer 216. The conductive channels of these transistors are all formed in the semiconductor layer 216 and the back-gates of these transistors are all formed from the third conductive material layer 212. The transistors comprise a transistor 207 of a first conductive type and a transistor 209 of a second conductive type. Preferably, the first conductive type is different from the second conductive type. A dielectric layer 218 covers the semiconductor layer 216 and the transistors.

The semiconductor structure 20 further comprises first isolation structures 201 and a second isolation structure 201' for electrically isolating the individual transistors, and a third isolation structure 201". The lower surfaces of the first isolation structures 201 and the third isolation structure 201" are flush with the lower surface of the second conductive material layer 208, or are below the lower surface of the second conductive material layer 208 and located in the second insulating material 206. The top surfaces of the first isolation structures 201 and the third isolation structure 201" are flush with or slightly higher than the upper surface of the semiconductor layer 216. The lower surface of the second isolation structure 201' is flush with the lower surface of the third conductive material layer 212, or is below the lower surface of the third conductive material layer 212 and located in the third insulating material 210. The top surface of the second isolation structures 201' is flush with or slightly higher than the upper surface of the semiconductor layer 216.

The above transistors are all completely surrounded by the isolation structures, so that a part of the area under each of the transistors is completely isolated laterally by the isolation structures. Specifically, as an example, the transistors 207 of the first conductive type each are completely surrounded by the first isolation structures 201, while the isolation structures surrounding each of the transistors 209 of the second conductive type are each made up of the second isolation structure 201' at least on one side of the transistor, namely, one transistor 209 of the second conductive type is electrically isolated from other transistors at least on one side by the second isolation structure 201'. The isolation structures surrounding each of the transistors 209 of the second conductive type are each made up of the first isolation structures 201 on the other sides of the transistor, so that the portions of the second conductive material layer 208 under each of the transistors 209 of the second conductive type are in electrical connection with the portions of the second conductive material layer 208 under the second isolation structure 201'. In one exemplary embodiment, the transistors 209 of the second conductive type may be completely surrounded only by the second isolation structure 201'.

It shall be noted herein that in some other embodiments of the present invention, all transistors 207 of the first conductive type or transistors 209 of the second conductive type may be replaced by a group of transistors to which a specific back-gate voltage need to be applied. In this case, it is unnecessary to limit the conductive type of each group of transistors. That is to say, each group of transistors may not necessarily have the same conductive type, as long as the same back-gate voltage can be applied to each group of the specific transistors without adding extra conductive contacts.

The semiconductor structure 20 further comprises: a conductive contact 211, which runs through the dielectric layer 218, the second isolation structure 201', and the third insulating material layer 210 to reach the upper surface of the second conductive material layer 208 or to be in the second conductive material layer 208; and a conductive contact 211', which runs through the dielectric layer 218, the third isolation structure 201", and the second insulating material layer 206 to reach the upper surface of the first conductive material layer 204 or to be in the first conductive material layer 204. A portion of the conductive contact 211 is embraced in the second isolation structure 201', and thus it only connects the second conductive material layer 208 to outside. A portion of the conductive contact 211' is embraced in the third isolation structure 201", and thus it only connects the first conductive material layer 204 to outside, as shown in FIG. 5. Of course, the semiconductor structure 20 further comprises the gate contact (not shown), the source/drain contacts, etc. of each transistor.

In the semiconductor structure 20 according to the present embodiment, as an example, a voltage can be applied to the back-gates of the transistors 207 of the first conductive type through the capacitive couplings between the third conductive material layer 212, the second conductive material layer 208, and the first conductive material layer 204. Besides, since the portions of the second conductive material layer 208 under each of the transistors 209 of the second conductive type are in electrical connection with the portions of the second conductive material layer 208 under the second isolation structure 201', a voltage can be applied to the back-gates of the transistors 209 of the second conductive type through the capacitive coupling between the third conductive material layer 212 and the second conductive material layer 208. Thus, it is unnecessary to separately form a back-gate contact for each of the transistors 207 and 209. Therefore, the area occupied by one device is reduced, and the utilization ratio of the wafer is increased.

A method for manufacturing the semiconductor structure 20 will be described below.

Figure 6:
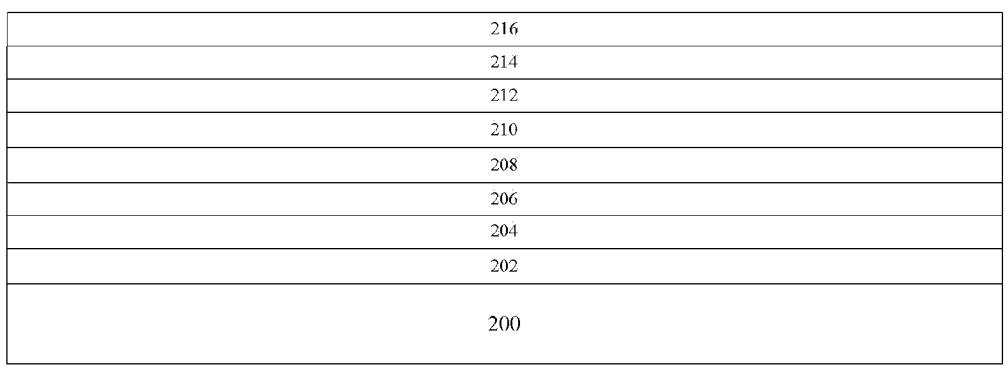
FIG. 6 shows a schematic cross-sectional view of a stage in manufacturing the semiconductor structure shown in FIG. 5.

First, a first insulating material layer 202, a first conductive material layer 204, a second insulating material layer 206, a second conductive material layer 208, a third insulating material layer 210, a third conductive material layer 212, and an insulating buried layer 214 are deposited in sequence on a semiconductor substrate 200. Preferably, the insulating buried layer 214 is a thin oxide layer. Then, a semiconductor layer 216 is bonded onto the insulating buried layer 214. The resulting structure is shown in FIG. 6. As an example, the semiconductor layer 216 can be bonded onto the insulating buried layer 214 by means of, for example, the SmartCut™ technique well known in the art, thereby forming a Semiconductor-On-Insulator (SOI) structure.

Figure 7:
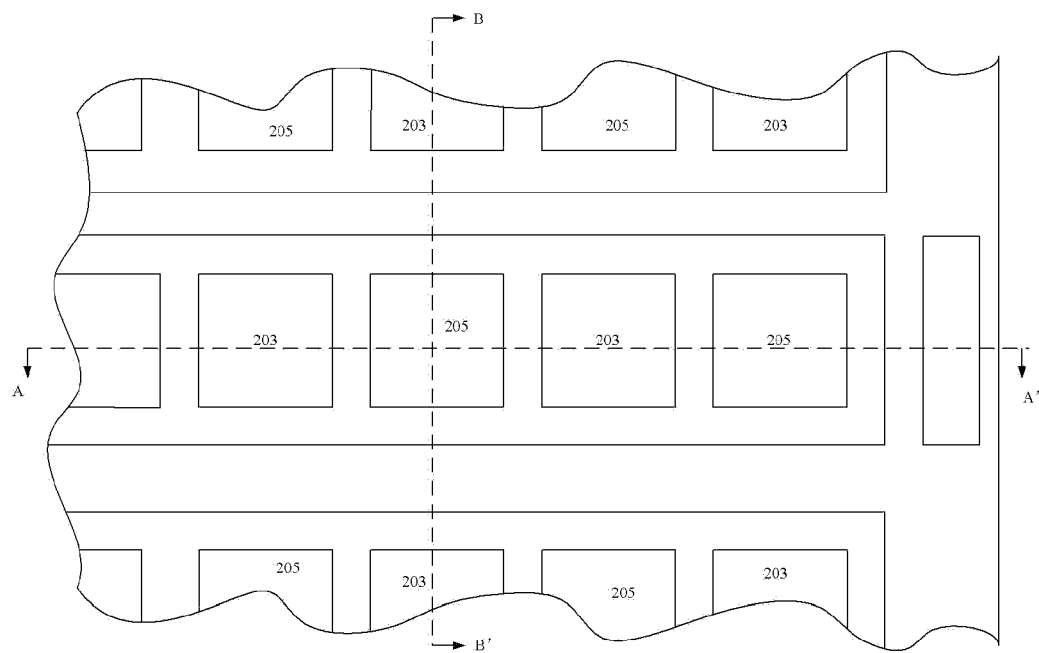
FIG. 7 shows a schematic top view of another stage in manufacturing the semiconductor structure shown in FIG. 5.
Figure 8:
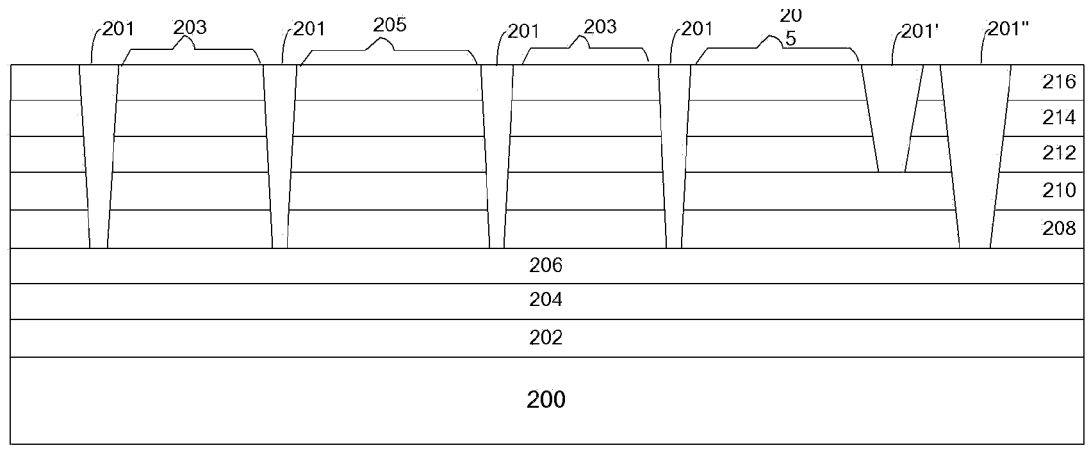
FIG. 8 shows a cross-sectional view taken along a line AA' of FIG. 7.
Figure 9:
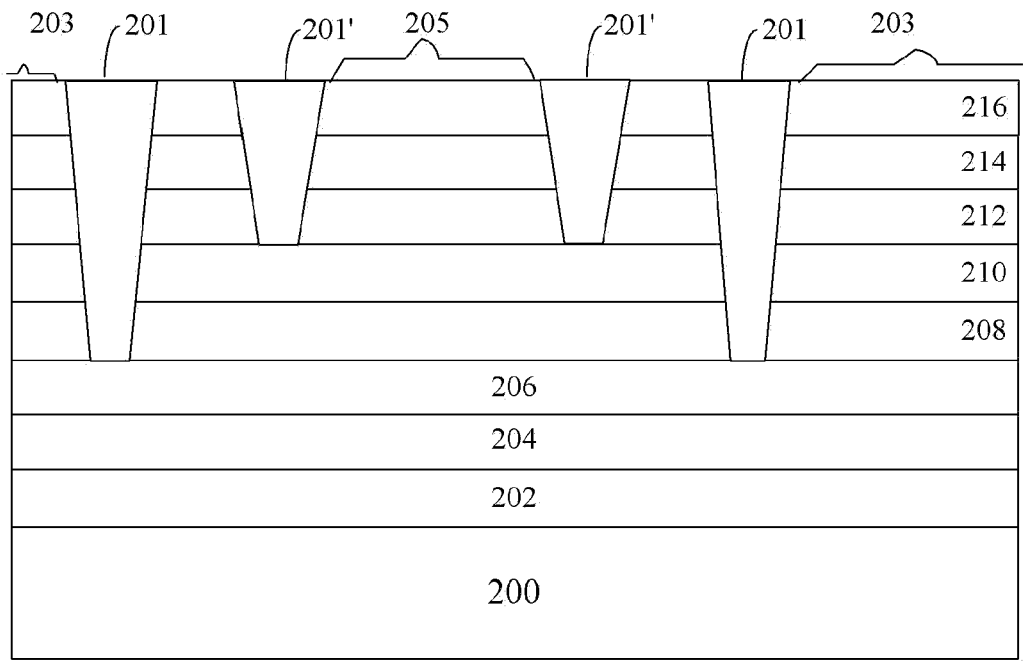
FIG. 9 shows a cross-sectional view taken along a line BB' of FIG. 7.

Next, by using a mask layer (e.g. a photoresist or hard mask layer) to cover the area in which transistors 207 of the first conductive type and the first isolation structures 201 surrounding the transistors 207 are to be formed, the second isolation structure 201' is formed on two opposite sides of the area in which transistors 209 of the second conductive type are to be formed. The lower surface of the second isolation structure 201' is flush with the lower surface of the third conductive material layer 212 or is in the third insulating material layer 210, while the top surface of the second isolation structure 201' is flush with or slightly higher than the upper surface of the semiconductor layer 216. Afterwards, the mask layer is removed. Next, by using a mask layer again to cover the area in which the transistors 209 of the second conductive type are to be formed as well as the area in which the isolation structure 201' has already been formed, the first isolation structures 201 are formed to surround the area in which the transistors 207 of the first conductive type are to be formed. At the same time, the third isolation structure 201" is formed. The lower surfaces of the isolation structures 201 and 201" are flush with the lower surface of the second conductive material layer 208 or are in the second insulating material layer 206, while the top surfaces of the isolation structures 201 and 201" are flush with or slightly higher than the upper surface of the semiconductor layer 216. Thus, the structures shown in FIGS. 7-9 are obtained, wherein FIG. 7 is a top view of the obtained structure, FIG. 8 is a cross-sectional view taken along a line AA' of FIG. 7, and FIG. 9 is a cross-sectional view taken along a line BB' of FIG. 7. Reference numbers 203 and 205 represent the areas in which the transistors 207 of the first conductive type and the transistors 209 of the second conductive type are to be formed, respectively.

It can be seen from FIGS. 7-9 that a voltage is applied to the back-gates of transistors 207 of the first conductive type through the capacitive coupling between the third conductive material layer 212, the second conductive material layer 208, and the first conductive material layer 204. Besides, since the portions of the second conductive material layer 208 under each of the transistors 209 of the second conductive type are in electrical connection with the portions of the second conductive material layer 208 under the second isolation structure 201', a voltage can be applied to the back-gates of the transistors 209 of the second conductive type through the capacitive coupling between the third conductive material layer 212 and the second conductive material layer 208. Thus, it is unnecessary to separately form a back-gate contact for each of the transistors 207 and 209, which further reduces the area occupied by one device and increases the utilization ratio of the wafer. In addition, the isolation structures as shown in FIGS. 7-9 and methods for forming the same are exemplary, and the present invention is not limited to them. The isolation structures 201 and 201' may be formed by one have ordinary skills in the art using any appropriate methods, as long as the portions of the second conductive material layer 208 under each of the transistors 209 of the second conductive type are in electrical connection with the portions of the second conductive material layer 208 under the second isolation structure 201'. The isolation structures 201, 201' and 201" may be formed by such processes as photolithography, etching, and deposition that are well known in the art, which will not be described in detail here in order to highlight the features and advantages of the present invention.

Then, the transistors 207 of the first conductive type and the transistors 209 of the second conductive type are formed in the areas 203 and 205 respectively using the process procedures well known in the art. Next, a dielectric layer 218, a top gate contact (not shown) and source/drain contact of each transistor, and so on, are formed. A conductive contact 211 is formed running through the dielectric layer 218, the second isolation structure 201' and the third insulating material layer 210. A conductive contact 211' is formed running through the dielectric layer 218, the third isolation structures 201" and the second insulating material layer 206. The above-mentioned process procedures are known in the art, so in order to highlight the features and advantages of the present invention, they will not be described in details herein.

Furthermore, in this embodiment, the position arrangements of the transistors 207 of the first conductive type and the transistors 209 of the second conductive type are also exemplary, and the present invention is not limited to them. In fact, the transistors 207 of the first conductive type and the transistors 209 of the second conductive type may be arranged in respective rows. Alternatively, the positions of transistors 207 and 209 may be arranged as required.

In addition, the grouping of transistors in the present invention is not limited to grouping based on the conductive types. The transistors of different conductive types which are expected to have the same back-gate voltage applied thereto may be grouped in one group as required, and other transistors of different conductive types which are expected to have another same back-gate voltage applied thereto may be grouped in another group. The first group of transistors and the second group of transistors may be respectively isolated in the same manner as the above described for the transistors 207 of the first conductive type and the transistors 209 of the second conductive type. Specifically, the first group of transistors are each completely surrounded by the first isolation structures 201, while the isolation structures surrounding the second group of transistors are each made up of the second isolation structure 201' on at least one side of the transistor, and are made up of the first isolation structures 201 on the other sides of the transistor, so that the voltage is applied to the back-gates of a group of transistors by means of only one conductive contact. For example, the two transistors 209 shown in FIG. 5 may also have different conductive types, but their back-gates may be applied to with the same voltage by using the solution in the embodiment of the present invention. In this embodiment, in addition to the isolation structures 201 for isolating transistors, isolation structure 201" is also formed for the conductive contact 211'. However, the present invention is not limited to the above embodiment, and the conductive contact 211" can be formed in any one of the isolation structures 201 by one have ordinary skills in the art as required. Moreover, although the conductive contact 211 is shown to be formed in the isolation structure 201' which is for electrically isolating the transistors 209 of the second conductive type, the present invention is not limited to this situation. Alternatively, an additional isolation structure may be formed separately for accommodating a portion of the conductive contact 211, the additional isolation structure having its lower surface being flush with the lower surface of the third conductive material layer 212 and its top surface being flush with or slightly higher than the upper surface of the semiconductor layer 216. For example, by designing isolation structures of different depths, the back-gate voltages of any group of some specific transistors can be controlled by one conductive contact, while the back-gate voltages of other transistors can be controlled by another different conductive contact. In this way, the area occupied by the conductive contacts can be greatly reduced and the utilization ratio of the wafer can be increased.

In addition, when describing the method for manufacturing the semiconductor structure 20, for ease of illustration and as an example, in the cross-section plane parallel to line BB' of FIG. 7, the second isolation structure 201' is designed to be on opposite sides of the transistor 209 of the second conductive type, while the first isolation structures 201 are designed to be on other opposite sides of the transistor 209 of the second conductive type and on each side of the transistor 207 of the first conductive type. It will be understood by one have ordinary skills in the art that the isolation structures surrounding the transistors 207 of the first conductive type and the transistors 209 of the second conductive type may also be arranged in other ways.

Figure 10:
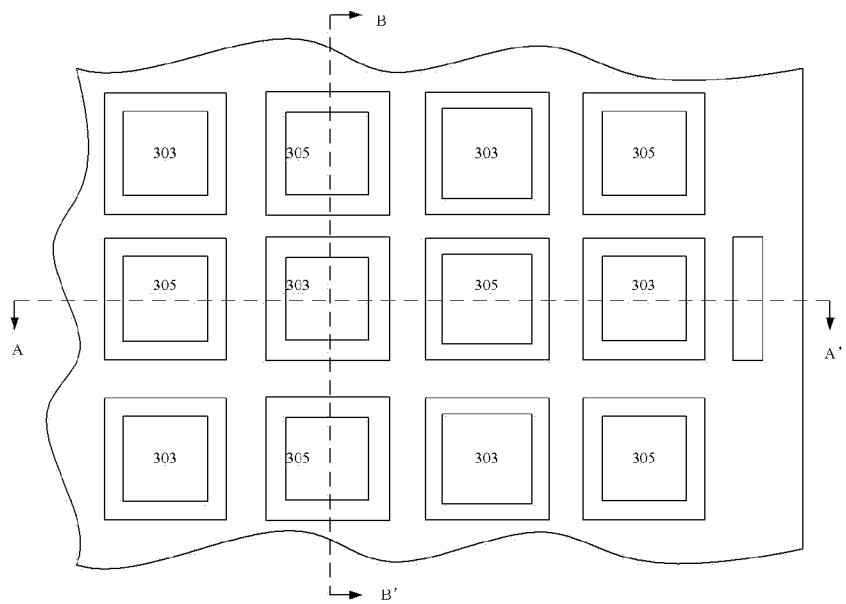
FIG. 10 shows a schematic top view of a layout of the isolation structures around the transistors according to an embodiment of the present invention.
Figure 11:
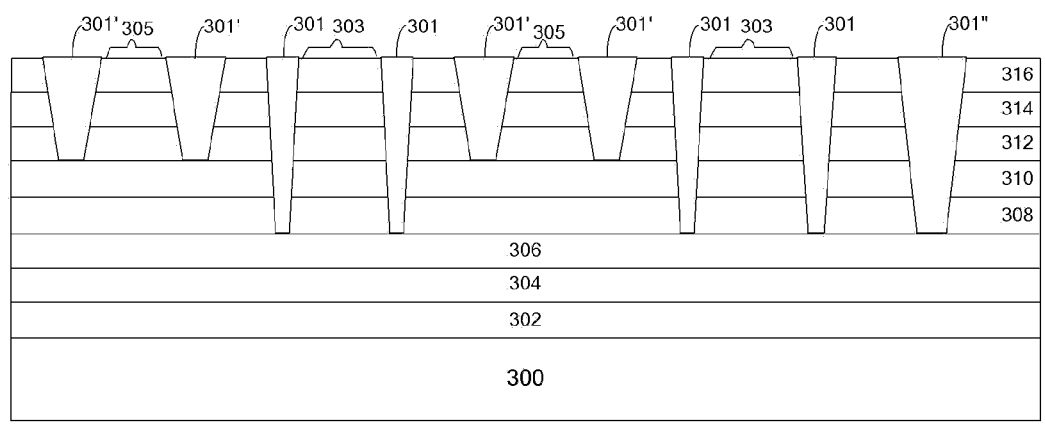
FIG. 11 shows a cross-sectional view taken along a line AA' of FIG. 10.
Figure 12:
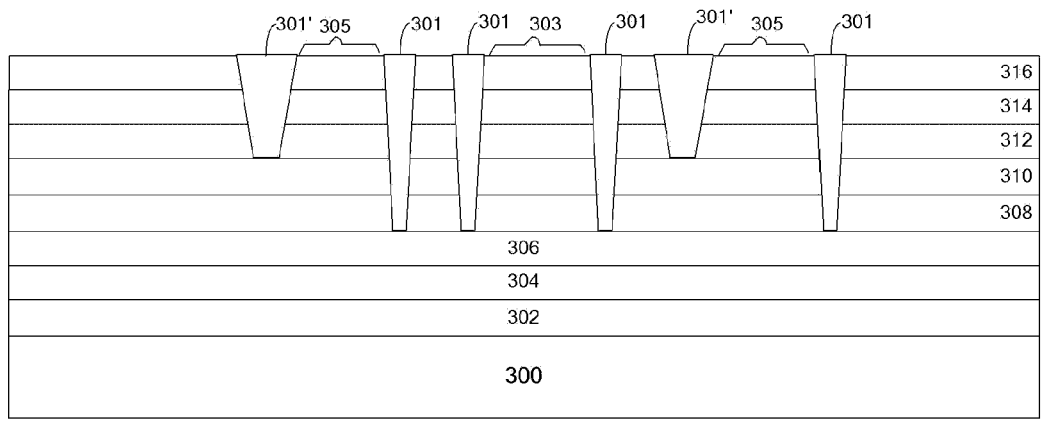
FIG. 12 shows a cross-sectional view taken along a line BB' of FIG. 10.

In order to illustrate different ways of arrangement of the first and second isolation structures, FIGS. 10-12 show another arrangement of the isolation structures surrounding the transistors according to an embodiment of the present invention. FIG. 10 is a top view, FIG. 11 is a cross-sectional view taken along a line AA' of FIG. 10, and FIG. 12 is a cross-sectional view taken along a line BB' of FIG. 10. For simplicity, the figures only exemplarily show the positions of the first and second isolation structures, while the transistors are omitted. Reference numbers 303 and 305 represent the areas in which the transistors of the first and second conductive types are to be formed, respectively.

It should be noted that, referring to FIG. 11, in the cross-section plane parallel to line AA' of FIG. 10, the second isolation structures 301' are arranged on both sides of the area 305 in which a transistor of the second conductive type is formed, while the first isolation structures 301 are arranged on both sides of the area 303 in which a transistor of the first conductive type is formed. In the cross-section plane parallel to line BB' of FIG. 10, the first isolation structure 301 and the second isolation structure 301' are respectively arranged on the two sides of the area 305 in which a transistor of the second conductive type is formed, while the first isolation structures 301 are arranged on both sides of the area 303 in which a transistor of the first conductive type is formed. Therefore, in this embodiment, the transistor of the first conductive type is completely surrounded by the first isolation structure 301, while the isolation structure that completely surround the transistor of the second conductive type is made up of the second isolation structure 301' on three sides of the transistor and the first isolation structure 301 on the remaining one side of the transistor. As a result, the portions of the second conductive material layer 308 under each of the transistors of the second conductive type are in electrical connection with the portions of the second conductive material layer 308 under the second isolation structures 301'.

Processes and Materials

In the embodiments described above, the layers involved may be deposited by means of Chemical Vapor Deposition (CVD), Physical Vapor Deposition (PVD), Pulsed Laser Deposition (PLD), Atomic Layer Deposition (ALD), Plasma Enhanced Atomic Layer Deposition (PEALD), or other appropriate processes as well known in the art. The photolithography and etching processes involved may be performed by Reactive Ion Etching (RIE), Electron Cyclotron Resonance (ECR) etching, Inductive Coupling Plasma (ICP) etching, etc. as well known in the art. The semiconductor substrates 100 and 200 involved are preferably silicon wafers. Of course, any other suitable substrates may be used as required. The first, second and third insulating material layers are preferably oxide layers. The first, second and third conductive material layers are preferably polysilicon layers, and can be made to have a low resistance through ion implantation in which n-type ion doping may be performed by using, for example, As and P, or p-type ion doping may be performed by using, for example, In and B, with the doping concentration being usually 1018~1021 cm−3. The material of the semiconductor layers 116 and 216 may include one or more material selected from the group consisting of Si, SiGe, SiC, and SiGeC. The isolation material of the isolation structures may be one or more material selected from the group consisting oxide and nitride. The material of the conductive contacts 111, 211 and 211' can be, but not limited to, one or more material selected from the group consisting Cu, Al, W, and polysilicon. Before forming the conductive contact 211 and/or 211', a contact liner may be formed from, for example, one or more material selected from the group consisting Ti and TiN.

While the invention has been described in detail by means of the various exemplary embodiments, it will be understood by those skilled in the art that many replacements and variants can be made to the present invention without departing from the spirit and scope of the present invention as defined by the appended claims.

What is claimed is:

1. A semiconductor structure, comprising:
   a semiconductor substrate;
   a first insulating material layer on the semiconductor substrate;
   a first conductive material layer on the first insulating material layer;
   a second insulating material layer on the first conductive material layer;
   a second conductive material layer on the second insulating material layer;
   an insulating buried layer on the second conductive material layer;
   a semiconductor layer on the insulating buried layer;
   transistors formed on the semiconductor layer, the transistors at least comprising a first group of transistors and a second group of transistors, the channel regions of the transistors each being formed in the semiconductor layer and each having a back-gate formed from the second conductive material layer;
   a dielectric layer covering the semiconductor layer and the transistors;
   isolation structures for at least electrically isolating each transistor from its adjacent transistors, the top of the isolation structures being flush with or slightly higher than the upper surface of the semiconductor layer, and the bottom of the isolation structures being in the second insulating material layer; and
   a conductive contact running through the dielectric layer and extending down into the first conductive material layer, the conductive contact being isolated from the transistors by means of at least one of the isolation structures, and the first conductive material layer being electrically connected to outside by the conductive contact to realize control of the back-gate voltages of the first group of transistors.

2. The semiconductor structure according to claim 1, wherein the conductive contact further runs through at least one of the isolation structures to extend down into the first conductive material layer.

3. The semiconductor structure according to claim 2, wherein the first group of transistors are nMOSFETs, the second group of transistors are pMOSFETs; or the first group of transistors are pMOSFETS, the second group of transistors are nMOSFETs.

4. The semiconductor structure according to claim 1, wherein the first group of transistors are nMOSFETs, the second group of transistors are pMOSFETs; or the first group of transistors are pMOSFETs, the second group of transistors are nMOSFETs.

5. A method for manufacturing a semiconductor structure, comprising:
providing a semiconductor substrate;
forming on the semiconductor substrate a first insulating material layer, a first conductive material layer, a second insulating material layer, a second conductive material layer and an insulating buried layer in sequence;
bonding a semiconductor layer on the insulating buried layer;
forming isolation structures running through the semiconductor layer, the insulating buried layer and the second conductive material layer, the top of the isolation structures being flush with or slightly higher than the upper surface of the semiconductor layer and the bottom of the isolation structure being in the second insulating material layer;
forming transistors on the semiconductor layer, the transistors at least comprising a first group of transistors and a second group of transistors, the channel regions of the transistors each being formed in the semiconductor layer and each having a back-gate formed from the second conductive material layer, wherein each transistor is isolated from its adjacent transistors by means of the isolation structures;
forming a dielectric layer covering the semiconductor layer and the transistors; and
forming a conductive contact running through the dielectric layer and extending down into the first conductive material layer, the conductive contact being isolated from the transistors by means of at least one of the isolation structures, and the first conductive material layer being electrically connected to outside by the conductive contact to realize control of the back-gate voltages of the first group of transistors.

6. The method according to claim 5, wherein the conductive contact further runs through at least one of the isolation structures to extend down into the first conductive material layer.

7. The method according to claim 6, wherein the first group of transistors are nMOSFETs, the second group of transistors are pMOSFETs; or the first group of transistors are pMOSFETs, the second group of transistors are nMOSFETs.

8. The method according to claim 5, wherein the first group of transistors are nMOSFETs, the second group of transistors are pMOSFETs; or the first group of transistors are pMOSFETs, the second group of transistors are nMOSFETs.

9. A semiconductor structure, comprising:
a semiconductor substrate;
a first insulating material layer on the semiconductor substrate;
a first conductive material layer on the first insulating material layer;
a second insulating material layer on the first conductive material layer;
a second conductive material layer on the second insulating material layer;
a third insulating material layer on the second conductive material layer;
a third conductive material layer on the third insulating material layer;
an insulating buried layer on the third conductive material layer;
a semiconductor layer on the insulating buried layer;
transistors formed on the semiconductor layer, the transistors at least comprising a first group of transistors and a second group of transistors, the channel regions of the transistors each being formed in the semiconductor layer and each having a back-gate formed from the third conductive material layer;
a dielectric layer covering the semiconductor layer and the transistors;
a plurality of first isolation structures, the top of which being flush with or slightly higher than the upper surface of the semiconductor layer and the bottom of which being in the second insulating material layer;
a plurality of second isolation structures, the top of which being flush with or slightly higher than the upper surface of the semiconductor layer and the bottom of which being in the third insulating material layer;
a first conductive contact running through the dielectric layer, one of the first isolation structures, and the second insulating material layer to reach the first conductive material layer; and
a second conductive contact running through the dielectric layer, one of the second isolation structures, and the third insulating material layer to reach the second conductive material layer,
wherein isolators surrounding each of the first group of transistors each comprise the first isolation structure, and isolators surrounding each of the second group of transistors each comprise the second isolation structure on at least one side of the respective one of the second group of transistors and comprise the first isolation structure on the remaining sides of the respective one of the second group of transistors, so that the portions of the second conductive material layer under each of the second group of transistors are in electrical communication with the portion of the second conductive material layer under the second conductive contact.

10. The semiconductor structure according to claim 9, wherein the isolators surrounding each of the second group of transistors each comprise the second isolation structure on opposite sides of the respective one of the second group of transistors, and comprise the first isolation structure on the other opposite sides of the respective one of the second group of transistors.

11. The semiconductor structure according to claim 10, wherein the first group of transistors are nMOSFETs, the second group of transistors are pMOSFETS; or the first group of transistors are pMOSFETs, the second group of transistors are nMOSFETs.

12. The semiconductor structure according to claim 9, wherein the first group of transistors are nMOSFETs, the second group of transistors are pMOSFETs; or the first group of transistors are pMOSFETs, the second group of transistors are nMOSFETs.

13. A method for manufacturing a semiconductor structure, comprising:
providing a semiconductor substrate;
forming on the semiconductor substrate a first insulating material layer, a first conductive material layer, a second insulating material layer, a second conductive material layer, a third insulating material layer, a third conductive material layer and an insulating buried layer in sequence;

bonding a semiconductor layer on the insulating buried layer;

forming a plurality of first isolation structures, the top of which being flush with or slightly higher than the upper surface of the semiconductor layer and the bottom of which being in the second insulating material layer;

forming a plurality of second isolation structures, the top of which being flush with or slightly higher than the upper surface of the semiconductor layer and the bottom of which being in the third insulating material layer;

forming transistors on the semiconductor layer, the transistors at least comprise a first group of transistors and a second group of transistors, the channel regions of the transistors each being formed in the semiconductor layer and each having a back-gate formed from the third conductive material layer;

forming a dielectric layer covering the semiconductor layer and the transistors;

forming a first conductive contact running through the dielectric layer, one of the first isolation structures, and the second insulating material layer; and forming a second conductive contact running through the dielectric layer, one of the second isolation structures, and the third insulating material layer, wherein isolators surrounding each of the first group of transistors each comprise the first isolation structure, and isolators surrounding each of the second group of transistors each comprise the second isolation structure on at least one side of the respective one of the second group of transistors and comprise the first isolation structure on the remaining sides of the respective one of the second group of transistors, so that the portions of the second conductive material layer under each of the second group of transistors are in electrical communication with the portion of the second conductive material layer under the second conductive contact.

14. The method according to claim 13, wherein the isolators surrounding each of the second group of transistors each comprise the second isolation structure on opposite sides of the respective one of the second group of transistors, and comprise the first isolation structure on the other opposite sides of the respective one of the second group of transistors.

15. The method according to claim 14, wherein the first group of transistors are nMOSFETs, the second group of transistors are pMOSFETs; or the first group of transistors are pMOSFETs, the second group of transitors are nMOSFETs.

16. The method according to claim 13, wherein the first group of transistors are nMOSFETs, the second group of transistors are pMOSFETs; or the first group of transistors are pMOSFETs, the second group of transistors are nMOSFETs. transistors are pMOSFETs, the second group of transistors are nMOSFETs.

* * * * *